(12) United States Patent
Allgaier et al.

(10) Patent No.: US 10,422,819 B2
(45) Date of Patent: Sep. 24, 2019

(54) MEASURING DEVICE

(71) Applicant: VEGA GRIESHABER KG, Wolfach (DE)

(72) Inventors: Volker Allgaier, Haslach i. K. (DE); Siegbert Woehrle, Schiltach (DE)

(73) Assignee: VEGA GRIESHABER KG, Wolfach (DE)

( * ) Notice: Subject to any disclaimer, the term of this patent is extended or adjusted under 35 U.S.C. 154(b) by 0 days.

(21) Appl. No.: 15/165,534

(22) Filed: May 26, 2016

(65) Prior Publication Data

US 2017/0097378 A1    Apr. 6, 2017

(30) Foreign Application Priority Data

Oct. 6, 2015  (EP) .................................... 15188638

(51) Int. Cl.
| | |
|---|---|
| *G01R 15/18* | (2006.01) |
| *G01R 19/165* | (2006.01) |
| *G01R 35/00* | (2006.01) |
| *H04Q 9/00* | (2006.01) |

(52) U.S. Cl.
CPC .......... *G01R 15/18* (2013.01); *G01R 19/165* (2013.01); *G01R 35/00* (2013.01); *H04Q 9/00* (2013.01); *H04Q 2209/30* (2013.01)

(58) Field of Classification Search
CPC ...... G01R 15/18; G01R 35/00; G01R 19/165; H04Q 9/00; H04Q 2209/30; G05B 19/00; G05B 2219/00; G08C 17/02
See application file for complete search history.

(56) References Cited

U.S. PATENT DOCUMENTS

| | | | | |
|---|---|---|---|---|
| 2002/0123345 | A1* | 9/2002 | Mahany | H04W 48/08 455/432.1 |
| 2005/0190054 | A1* | 9/2005 | Scott | G05B 23/027 340/517 |
| 2005/0289276 | A1* | 12/2005 | Karschnia | G05B 19/4185 710/305 |
| 2008/0147336 | A1* | 6/2008 | Karbula | G01D 9/005 702/64 |
| 2008/0280568 | A1 | 11/2008 | Kielb et al. | |
| 2010/0164717 | A1* | 7/2010 | Hammer | G05B 19/0425 340/540 |
| 2014/0170989 | A1* | 6/2014 | Ichtertz | H04W 52/0235 455/70 |

(Continued)

FOREIGN PATENT DOCUMENTS

| | | |
|---|---|---|
| EP | 1 293 853 A1 | 3/2003 |
| EP | 1 519 977 A1 | 11/2005 |

*Primary Examiner* — Akm Zakaria
(74) *Attorney, Agent, or Firm* — William Gray Mitchell

(57) ABSTRACT

The invention relates to a measuring arrangement having a two-wire field device comprising a control unit, a sensor, and a radio module, a superordinate unit to which the field device is connected via a two-wire line, wherein signals from the field device are transmitted to the superordinate unit at least as a current injected by the field device in a predetermined range to the superordinate unit, wherein an error current below the predetermined range signals an error, and a maintenance current above the predetermined range signals a maintenance mode, and the field device is designed in such a manner that the maintenance current feeds the radio module in the radio operation.

12 Claims, 1 Drawing Sheet

(56) References Cited

U.S. PATENT DOCUMENTS

2016/0124408 A1\* 5/2016 Schauble ........... G05B 19/0426
    307/112
2016/0161533 A1\* 6/2016 Simon ................ G01R 19/1659
    324/103 R \* cited by examiner

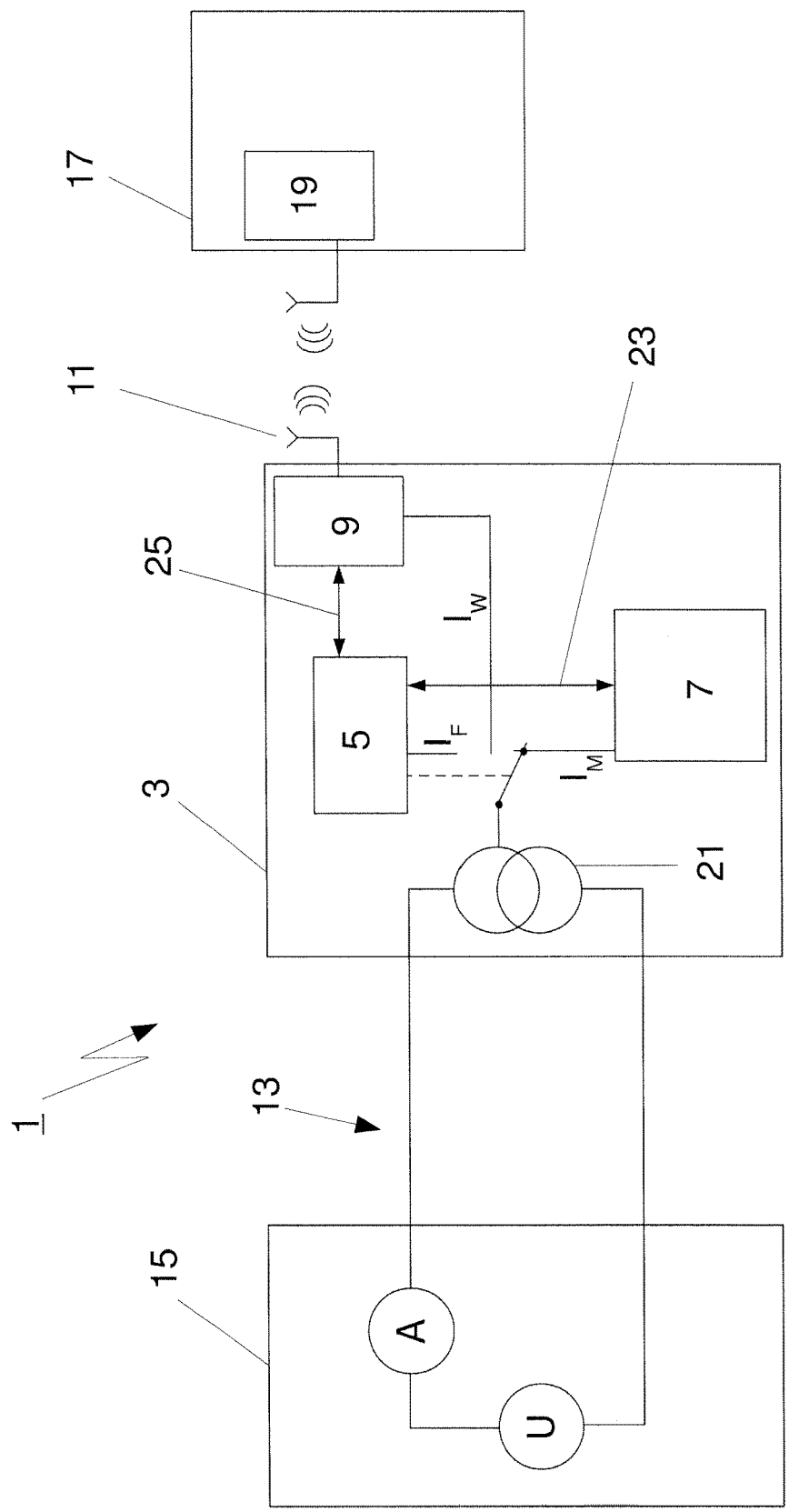

MEASURING DEVICE

CROSS REFERENCE TO RELATED APPLICATIONS

This patent application claims priority to European Patent Application 15 188 638.9, filed on Oct. 6, 2015.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The present invention relates to a measuring device having a two-wire field device, a two-wire field device, as well as a method for operating a two-wire field device.

Background of the Invention

In process automation technology frequently field devices are used, which detect and/or influence process variables. Examples for such field devices are level gauges, limit meters, and manometers having sensors, which detect the respective process variables fill level, limit, or pressure. Frequently such field devices are connected to superordinate units, for example guidance systems or control units. These superordinate units are used for process control, process visualization, and/or process monitoring.

The energy transmission and/or signal transmission between the field device and any superordinate units occurs frequently according to the known 4 mA to 20 mA standard, in which a 4 mA to 20 mA current loop and/or a two-wire line is formed between the field device and the superordinate unit. In addition to the analog transmission of signals, there is the option that the measuring devices as per various other protocols, particularly digital protocols, transmit additional information to the superordinate units or receive them therefrom. Examples to be mentioned here are the HART-protocol or the Profibus-PA protocol.

The energy supply of these field devices also occurs via the 4 mA to 20 mA current signal, and therefore in addition to the two-wire line no additional supply line is required. In order to keep as low as possible the wiring expense and installation expense as well as the safety measures, for example when used in areas to be protected from explosion, it is not desired to provide additional current supply lines.

From the prior art for example control units are known which are connected to the 4 mA to 20 mA current loop for physically communicating with the field device, in order to in this manner allow the operation of the field device via the 4 mA to 20 mA current loop by means of the HART-protocol. Such control units are disadvantageous in that, as already mentioned, they must be physically connected to the 4 mA to 20 mA current loop. For this purpose, the two-wire line must be modified in such a manner, for example isolated and/or severed, that the control unit can be connected thereto. This is relatively labor-intensive and is not always readily possible on-site. Alternatively a control device can also be connected to an existing HART-resistor, and in that case no severing of the line is necessary.

It is further known from the prior art to use radio modules for operating the field devices in an easier manner. Here, solutions are known in which the field devices comprise integrated radio modules, radio modules are retrofitted, or they are arranged in a measuring transformer—feeding device, a device for supplying energy to the field devices. In particular in case of the variants having an integrated radio module or having a radio module that shall be retrofitted for example with modularly designed field devices, the problem exists in the prior art that an energy supply via the 4 mA to 20 mA current loop allows only extremely low transmission powers of the radio modules or the operation of the radio module is only possible with low transmission power due to the energy available being limited, or the energy supplied via the current loop is insufficient to supply the radio module with sufficient energy, and therefore operation is impossible or is only possible with considerable limitations.

Here, solutions are known from the prior art in which the radio module is provided with a separate energy supply or additional energy sources are provided, such as batteries, energy harvesters, or the like for operating the radio module in the field device. Both of the above-mentioned solutions have an increased installation requirements and maintenance requirements, and therefore they are considered disadvantageous.

The problem addressed by the present invention is that of providing a measuring device having a two-wire field device, a two-wire field device, as well as a method for operating a two-wire field device which solves the disadvantages of the prior art and particularly can forgo any additional energy supply, particularly additionally wired or a partially or completely battery operated energy supply.

Said problem is solved by a measuring device, a two-wire field device, as well as a method for operating a two-wire field device, each having the features described herein.

BRIEF SUMMARY OF THE INVENTION

In a preferred embodiment, a measuring arrangement having a two-wire field device having (1) a control unit, a sensor, and a radio module, (2) a superordinate unit to which the field device is connected via a two-wire line, signals from the field device being transmitted to the superordinate unit at least as a current injected by the field device in a predetermined range to the superordinate unit, wherein an error current below the predetermined range signals an error and a maintenance current above the predetermined range signals a maintenance mode and the field device is designed in such a manner that the maintenance current feeds the radio module in radio operation.

In another preferred embodiment, the measuring arrangement of claim 1, wherein the control unit is designed in such a manner that during an active radio connection of the radio module, particularly an active radio connection requiring an increased data rate, the maintenance current is activated.

In another preferred embodiment, the measuring arrangement of claim 2, wherein the control unit and the radio module are connected in such a manner that an active radio connection of the radio module, particularly an active radio connection requiring increased data rate, is signaled to the control unit.

In another preferred embodiment, the measuring arrangement of claim 1, wherein the measuring current is within the predetermined range from 4 mA to 20 mA, the error current is lower than 4 mA, particularly amounts to 3.6 mA, and the maintenance current is greater than 20 mA, particularly amounts to 22 mA.

In another preferred embodiment, the measuring arrangement of claim 1, wherein in the maintenance mode no signals are transmitted to the superordinate unit and said unit acts as a pure energy source.

In another preferred embodiment, the measuring arrangement of claim 1, wherein the sensor and the radio module are connected to the control unit.

In an alternate preferred embodiment, a two-wire field device having a control unit, a sensor, and a radio module for connecting via a two-wire line to a superordinate unit, the field device being designed in such a manner that signals are transmitted to the superordinate unit at least as an injected current in a predetermined range to the superordinate unit, further comprising wherein an error current below the predetermined range signals an error and a maintenance current above the predetermined range signals a maintenance mode, and the field device is designed in such a manner that the maintenance current feeds the radio module in the radio operation.

In another preferred embodiment, the two-wire field device of claim 7, wherein the control unit is designed in such a manner that it activates the maintenance mode during an active radio connection of the radio module.

In another preferred embodiment, the two-wire field device of claim 7, wherein the control unit and the radio module are connected in such a manner that the control unit signals an active radio connection of the radio module.

In another preferred embodiment, the two-wire field device of claim 7, wherein the measuring current is within the predetermined range from 4 mA to 20 mA, the error current amounts to less than 4 mA, particularly 3.6 mA, and the maintenance current amounts to more than 20 mA, particularly 22 mA.

In another preferred embodiment, the two-wire field device of claim 7, wherein the maintenance mode no signals are transmitted to the superordinate unit and it operates as a pure energy source.

In another preferred embodiment, the two-wire field device of claim 7, wherein the sensor and the radio module are connected to the control unit.

In a preferred embodiment, a method for operating a two-wire field device having a control unit, a sensor, and a radio module, wherein the field device can be connected via a two-wire line to a superordinate unit and signals are transmitted from the field device to the superordinate unit at least as an injected current in a predetermined range to the superordinate unit, further comprising wherein by means of an error current below the predetermined range an error is signaled and by means of a maintenance current above the predetermined range a maintenance mode is signaled, the maintenance current feeding the radio module in an active radio connection.

In another preferred embodiment, the method as described herein, wherein after conclusion of an active radio connection of the radio module the maintenance current is deactivated and depending on the condition of the field device an error current or a measuring current is activated.

BRIEF DESCRIPTION OF THE DRAWINGS

FIG. 1 is a line drawing evidencing an exemplary embodiment of a measuring device according to the invention.

DETAILED DESCRIPTION OF THE INVENTION

A measuring device according to the invention comprises a two-wire field device having a control unit, a sensor, and a radio module, the field device being connected via a two-wire line to a superordinate unit, and signals from the field device to the superordinate unit are transmitted at least as a current injected by the field device in a predetermined range to the superordinate unit. According to the invention an error current below the predetermined range signals an error, a maintenance current above the predetermined range signals a maintenance mode, and the field device is designed in such a manner that the maintenance current feeds the radio module in a radio operation.

In the 4 mA to 20 mA protocol known from the prior art current values outside of the predetermined range from 4 mA to 20 mA, in which a measuring current is transmitted, is typically detected as an error and thus used to transmit error conditions of the field device to the superordinate unit, for example the guidance system or the control unit. Alternatively, the option is given to signal an error merely by means of a current injected below the predetermined range and to inform the superordinate unit by means of a current above the predetermined range so that the field device goes into a maintenance mode. In this manner the superordinate unit does not react by means of a malfunction, but rather waits for the end of the maintenance mode and then returns to the regular measuring operation. In the known 4 mA to 20 mA protocol it can here be achieved that in the maintenance mode an amperage of 22 mA is injected to the two-wire line and thus is available to supply the radio module in a radio operation. In this manner the radio module can be operated in certain situations by means of higher power levels and thus greater distances or higher data transmission can be achieved. Due to the fact that during the injection of the maintenance current no [analog] data transmission occurs via the two-wire line, at this point of time it no longer operates as a measuring device or control device but as a pure power supply and/or voltage source.

The control unit is here designed ideally in such a manner that during an active radio connection of the radio module, particularly an active radio connection in a mode for an increased data rate, it activates the maintenance current and thus the maintenance mode. If for example the control unit and the radio module are interconnected in such a manner that an active radio connection of the radio module is signaled, particularly a radio connection having an increased data rate, it can inject the maintenance current to the two-wire line if necessary such that sufficient energy is available for the radio connection.

For typical applications the predetermined range amounts to the measuring current of 4 mA to 20 mA, the error current amounts to less than 4 mA, particularly 3.6 mA, and the maintenance current amounts to more than 20 mA, particularly 22 mA.

In order to have available as much energy as possible for the radio module, in the maintenance mode no analog signals are transmitted to the superordinate unit, and therefore it operates as a pure energy source. However, digital signals can still be transmitted, for example via the HART-protocol. Ideally, both the sensor and the radio module are connected to the control unit of the field device such that it can take over as the central unit of all control functions. In particular, in this manner it is possible that the control unit transmits for example measurements of the sensor to the radio module for forwarding to a receiver or, in case of radio transmissions requiring a lot of energy, that the sensor is even temporarily deactivated.

Further, the control unit can this manner, when the radio transmission has concluded, inject the analog measuring signal back to the two-wire line.

The two-wire field device according to the invention comprises a control unit, a sensor, and a radio module and is designed for connecting a superordinate unit via a two-wire line, the field device further being designed in such a manner that it transmits signals to the superordinate unit at least as a current injected in a predetermined range to the superordinate unit and is therefore characterized in that an error current below the predetermined range signals an error and a maintenance current above the predetermined range signals a maintenance mode and the field device is designed in such a manner that the maintenance current feeds the radio module in the radio operation mode.

A method according to the invention for operating a two-line field device having a control unit, a sensor, and a radio module, in which the field device can be connected via a two-wire line to a superordinate unit and signals are transmitted from the field device to the superordinate unit at least as an injected current in a predetermined range, is characterized in that by means of an error current below the predetermined range an error is signaled and by means of a maintenance current above the predetermined range a maintenance mode is signaled, the maintenance current feeding the radio module in an active radio connection.

DETAILED DESCRIPTION OF THE FIGURES

FIG. 1 shows a block diagram of a measuring arrangement 1 according to the invention, said arrangement having a two-line field device 3, which is connected via a two-wire line 13 to a superordinate unit 15, which in the present example is designed as a storage-programmable control (SPS). The two-wire field device 3 communicates with the superordinate unit 15 according to the 4 mA to 20 mA protocol. In this 4 mA to 20 mA protocol a measuring signal of a sensor 7 contained in a field device 3 is converted to a current from 4 mA to 20 mA, proportional to the measuring signal, and injected to the two-wire line 13. A current outside of the predetermined range from 4 mA to 20 mA represents a condition outside of the measuring mode and is interpreted by the superordinate unit 15, depending on programming, as an error or as a signal for a maintenance mode of the field device 3. Via the two-wire line 13 both the transmission of measuring signals and an energy supply of the two-line field device 3 occur. The field device 3 substantially comprises a sensor 7 for detecting a measuring parameter, for example a fill status, which is connected via a connection 23 to a control unit 5. In the present exemplary embodiment the field device 3 can substantially assume three different conditions, wherein in a measuring mode a measuring current $I_M$, which represents a measuring signal of the sensor 7, is injected by means of a current sink 21 to the two-wire line 13. The measuring current $I_M$ is proportional to the measuring signal of the sensor 7 and can be applied to the two-wire line 13 either directly by the sensor 7 or via the control unit 5.

In the present exemplary embodiment the field device 3 and the superordinate unit 15 are adjusted to each other such that currents above the agreed range from 4 mA to 20 mA are considered a signal for a maintenance mode and currents below the agreed range are considered a signal for an error.

In a second state, a radio module 9 arranged in the field device 3 is activated and is supplied with energy via the two-wire line 13. In order to increase a transmission power of the radio module 9 or to allow a higher data rate by means of the radio module 9, in this second state a so-called maintenance current $I_W$ is injected to the two-wire line 13. The maintenance current $I_W$ is above the predetermined range for the measuring current $I_M$ and signals to the superordinate unit 15 thereby that the field device 3 is in a maintenance mode, which simultaneously means that no error is given and the superordinate unit 15 will not react to this signal with a malfunction.

By applying the maintenance current $I_W$ the superordinate unit 15 is signaled that the field device is in a maintenance mode and thus no measurements are transmitted via the two-wire line 13. Due to the fact that the maintenance current $I_W$ is above the measuring range from 4 mA to 20 mA, in the present case amounting to 22 mA, more power is available for the operation of the radio module 9 allowing a greater range or a higher data rate. In order to signal an activation of the radio module 9, it is connected via a connection 25 to the control unit 5. In this manner the control unit 5 can be directly informed by the radio module 9 that a radio connection is active and thus there is an increased energy demand.

In a third state in which there is a malfunction of the field device 3, an error current $I_F$ of 3.6 mA in the present case, i.e. below the measuring range from 4 mA to 20 mA, is applied on the two-wire line 13, causing the superordinate unit 15 to be informed of the existence of the malfunction. Accordingly, an error message can be issued by the superordinate unit 15.

An antenna 11 is arranged downstream of the radio module 9, which antenna communicates via a radio connection with a second radio module 19 of a mobile device 17. In the present exemplary embodiment the mobile device can therefore be used for the configuration of the field device 3 and/or for displaying measurements on-site. In this manner it is possible for example that the field device 3 can be designed without its own display and still allows, without the generation of a physical connection to the field device 3, an on-site display of measurements or a calibration or other settings of the field device 3.

LIST OF REFERENCE NUMBERS 1 measuring arrangement
3 field device
5 control unit
7 sensor
9 radio module
11 antenna
13 two-wire line
15 superordinate unit
17 mobile device
19 radio module at the mobile device
21 current sink
23 connection
25 connection $I_M$ measuring current
$I_F$ error current
$I_W$ maintenance current The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable equivalents.

We claim:

1. A measuring arrangement having
   a two-wire field device having a control unit, a sensor, and a radio module,
   a superordinate unit to which the field device is connected via a two-wire line, the field device is configured to operate in three different states, wherein:
   in a first state for measuring, a measuring current, which represents a measuring signal of the sensor and lies in a predetermined range, is injected by means of a current sink to the two-wire line, wherein the measuring current can be applied to the two-wire line either directly by the sensor or via the control unit,
   in a second state for maintenance, a maintenance current is injected to the two-wire line, wherein the maintenance current is above the predetermined range for the measuring current and signals to the superordinate unit thereby that the field device is in a maintenance mode, which simultaneously means that no error is given and the superordinate unit will not react to the maintenance current with a malfunction,
   in a third state for malfunction, an error current below the predetermined range for the measuring current is applied on the two-wire line, causing the superordinate unit to be informed of the existence of the malfunction, so that an error message can be issued by the superordinate unit, and
   the control unit is configured such that during an active radio connection of the radio module requiring an increased data rate, the maintenance current is activated.

2. The measuring arrangement of claim 1, wherein the control unit and the radio module are connected in such a manner that an active radio connection of the radio module, particularly an active radio connection requiring increased data rate, is signaled to the control unit.

3. The measuring arrangement of claim 1, wherein the measuring current is within the predetermined range from 4 mA to 20 mA, the error current is lower than 4 mA, particularly amounts to 3.6 mA, and the maintenance current is greater than 20 mA, particularly amounts to 22 mA.

4. The measuring arrangement of claim 1, wherein in the maintenance mode no signals are transmitted to the superordinate unit and said unit only acts as an energy source.

5. The measuring arrangement of claim 1, wherein the sensor and the radio module are connected to the control unit.

6. A two-wire field device having a control unit, a sensor, and a radio module for connecting via a two-wire line to a superordinate unit, the field device is configured to operate in three different states, wherein:
   in a first state for measuring, a measuring current, which represents a measuring signal of the sensor and lies in a predetermined range, is injected by means of a current sink to the two-wire line, wherein the measuring current can be applied to the two-wire line either directly by the sensor or via the control unit,
   in a second state for maintenance, a maintenance current is injected to the two-wire line, wherein the maintenance current is above the predetermined range for the measuring current and signals to the superordinate unit thereby that the field device is in a maintenance mode, which simultaneously means that no error is given and the superordinate unit will not react to the maintenance current with a malfunction,
   in a third state for malfunction, an error current below the predetermined range for the measuring current is applied on the two-wire line, causing the superordinate unit to be informed of the existence of the malfunction, so that an error message can be issued by the superordinate unit, and
   wherein the control unit configured such that it activates the maintenance mode during an active radio connection of the radio module.

7. The two-wire field device of claim 6, wherein the control unit and the radio module are connected in such a manner that the control unit signals an active radio connection of the radio module.

8. The two-wire field device of claim 6, wherein the measuring current is within the predetermined range from 4 mA to 20 mA, the error current amounts to less than 4 mA, particularly 3.6 mA, and the maintenance current amounts to more than 20 mA, particularly 22 mA.

9. The two-wire field device of claim 6, wherein the maintenance mode no signals are transmitted to the superordinate unit and it operates only as an energy source.

10. The two-wire field device of claim 6, wherein the sensor and the radio module are connected to the control unit.

11. A method for operating a two-wire field device having a control unit, a sensor, and a radio module, wherein the field device can be connected via a two-wire line to a superordinate unit, the field device is configured to operate in three different states, wherein
    in a first state for measuring, a measuring current, which represents a measuring signal of the sensor and lies in a predetermined range, is injected by means of a current sink to the two-wire line, wherein the measuring current can be applied to the two-wire line either directly by the sensor or via the control unit,
    in a second state for maintenance, a maintenance current is injected to the two-wire line, wherein the maintenance current is above the predetermined range for the measuring current and signals to the superordinate unit thereby that the field device is in a maintenance mode, which simultaneously means that no error is given and the superordinate unit will not react to the maintenance current with a malfunction, and
    in a third state for malfunction, an error current below the predetermined range for the measuring current is applied on the two-wire line, causing the superordinate unit to be informed of the existence of the malfunction, so that an error message can be issued by the superordinate unit.

12. The method according to claim 11, wherein after conclusion of an active radio connection of the radio module the maintenance current is deactivated and depending on the condition of the field device the error current or the measuring current is activated.

* * * * *